(12) United States Patent
Rickers

(10) Patent No.: US 9,942,962 B2
(45) Date of Patent: Apr. 10, 2018

(54) ELECTRONIC DEVICE, DEVICE DRIVER, AND DRIVING METHOD

(71) Applicant: OLEDWORKS GMBH, Aachen (DE)

(72) Inventor: Christoph Rickers, Wendhausen (DE)

(73) Assignee: OLEDWORKS GMBH, Aachen (DE)

( * ) Notice: Subject to any disclaimer, the term of this patent is extended or adjusted under 35 U.S.C. 154(b) by 46 days.

(21) Appl. No.: 15/124,546

(22) PCT Filed: Mar. 10, 2015

(86) PCT No.: PCT/EP2015/054869
§ 371 (c)(1),
(2) Date: Sep. 8, 2016

(87) PCT Pub. No.: WO2015/135889
PCT Pub. Date: Sep. 17, 2015

(65) Prior Publication Data
US 2017/0019974 A1 Jan. 19, 2017

(30) Foreign Application Priority Data

Mar. 13, 2014 (EP) ..................................... 14159476

(51) Int. Cl.
*H05B 33/08* (2006.01)
*H01L 23/544* (2006.01)
(Continued)

(52) U.S. Cl.
CPC ....... *H05B 33/0896* (2013.01); *H01L 23/544* (2013.01); *H01L 33/38* (2013.01);
(Continued)

(58) Field of Classification Search
CPC ............ H01L 51/5012; H01L 51/5203; H01L 51/5206; H01L 51/5212;
(Continued)

(56) References Cited

U.S. PATENT DOCUMENTS 7,145,289 B2 * 12/2006 Yamazaki ............ G01N 33/497
313/498
8,686,635 B2 4/2014 Choi
(Continued)

FOREIGN PATENT DOCUMENTS

DE 102013109814 A1 3/2015
EP 1244334 A2 9/2002
(Continued)

OTHER PUBLICATIONS

International Search Report and Written Opinion issued in PCT Application No. PCT/EP2015/054869 dated Jun. 10, 2015, 10 pages.
(Continued)

*Primary Examiner* — Haissa Philogene

(57) ABSTRACT

An electronic device is provided in which a dedicated area of the device substrate is patterned to form a resistive track so that it can be contacted by a readout arrangement. The resistive track is used to encode information. The information is provided to a driver which can then derive information about the type of device being driven. The driver can thus be controlled accordingly.

16 Claims, 6 Drawing Sheets

(51) Int. Cl.
*H01L 33/38* (2010.01)
*H01L 51/52* (2006.01)

(52) U.S. Cl.
CPC .......... *H01L 51/52* (2013.01); *H01L 51/5209* (2013.01); *H01L 51/5225* (2013.01); *H05B 33/0848* (2013.01); *H01L 2223/54413* (2013.01); *H01L 2223/54493* (2013.01)

(58) Field of Classification Search
CPC . H01L 2223/54493; H01L 2223/54413; H01L 2251/5361; H05B 33/0848; H05B 33/0896; Y02B 20/36
See application file for complete search history.

(56) References Cited

U.S. PATENT DOCUMENTS

| | | |
|---|---|---|
| 2004/0195979 A1 | 10/2004 | Plotz et al. |
| 2007/0029939 A1 | 2/2007 | Burkum et al. |
| 2011/0048506 A1 | 3/2011 | Pichler |
| 2013/0082997 A1 | 4/2013 | Wurzel et al. |
| 2016/0211476 A1 | 7/2016 | Ingle et al. |

FOREIGN PATENT DOCUMENTS

| | | |
|---|---|---|
| EP | 1411750 A2 | 4/2004 |
| EP | 1411750 A3 | 12/2004 |
| EP | 1244334 A3 | 4/2005 |
| WO | 2009057041 A1 | 5/2009 |
| WO | 2010029459 A1 | 3/2010 |

OTHER PUBLICATIONS

European Examination Report and Extended European Search Report issued in EP Application No. 14159476.2 dated Aug. 28, 2014, 7 pages.

* cited by examiner

US 9,942,962 B2

ELECTRONIC DEVICE, DEVICE DRIVER, AND DRIVING METHOD

FIELD OF THE INVENTION

This invention relates to electronic devices which include a component having electrical characteristics which may need to be taken into account when driving the component. One example of particular interest is an LED device, its associated driver and driving method.

BACKGROUND OF THE INVENTION

It is known that it is desirable for an LED driver to able to recognise the type of LED to which it is connected, and that an LED device can be arranged to provide information about its characteristics to enable a driver to be controlled accordingly.

In this description and claims, the term "LED" will be used to denote both organic and inorganic LEDs, and the invention can be applied to both categories. The invention can also be applied to other types of electronic device, such as solar cells. The detailed examples below are based on OLEDs but all examples can use inorganic LEDs instead, and the same concepts can applied to other driven devices.

LEDs are current driven lighting units. They are driven using an LED driver which delivers a desired current to the LED.

The required current to be supplied varies for different lighting units, and for different configurations of lighting unit. The latest LED drivers are designed to have sufficient flexibility that they can be used for a wide range of different lighting units, and for a range of numbers or lighting units.

To enable this flexibility, it is known for the driver to operate within a so-called "operating window". An operating window defines a range of output voltages and output currents, or a relationship between the output voltage and output current that can be delivered by the driver. Providing the requirements of a particular lighting load fall within this operating window, the driver is able to be configured for use with that particular lighting load, giving the desired driver flexibility.

The driver has its output current set to the desired level within its operating window.

Different types of LEDs (with different shape, colour, size, organics or brightness) require different electrical driving parameters such as current and voltage. Several proposals have been made to encode the type of the OLED into its structure, which can be read out using dedicated detector terminals (either wired sockets or capacitively coupled pads). This enables the driver to be programmed to deliver a specific current.

A much simpler way is to use resistors (or other components) to code the type of the OLED or the requited driving current. In this way, a current setting resistor or other component, outside the driver, is read by the driver. The value of the current setting resistor or other component is measured by the driver, which can then configure its output accordingly, so that the output current is determined by the resistance value. The important point is that after the driver has been produced, the output current can be selected, so that a single driver design is suitable for a range of output currents.

Once the current has been set, the voltage delivered by the driver will vary depending on the load presented to it (since the LEDs are current driven), but the driver will maintain this voltage within the operating window.

There is a particular need for a flexible driver because OLED technology is quite new and developing fast. Times between innovation of new materials and OLED architectures to give improved performance data (lumen, brightness, efficiency, size, . . . ) are very short, for example compared to typical support periods for products using the OLEDs. This support period is typically in the range of multiple years. Driver electronics also develops quickly to keep up with the demands of the new devices, particularly as driver architectures from historical LED technology cannot be simply copied to support OLEDs as well.

Although lifetime and reliability of OLEDs is also continuously improving, failed products have to be replaced. The required performance of typical devices requires the implementation of multiple OLEDs per luminaire. There is a need to be able to exchange just one OLED within such a device, and to then use an updated OLED device design. For example, it is desired not to produce old device architectures longer than required, so that all production time can be allocated to state of the art devices.

One way to support older OLEDs with newer drivers or drive newer OLEDs in applications equipped also with older devices is to provide a flexible driver which knows how to drive the OLED appropriately (reduced current, dedicated dimming levels, and any other OLED characteristics and settings) and this is enabled by the current setting resistor (or capacitor) as mentioned above. These components can be provided on a Printed Circuit Board (PCB) attached to the OLED.

A drawback of this approach is that everything added to the back of the OLED contributes to the overall thickness of the luminaire/module. It also requires additional pick and place steps as well as solder steps to apply the resistor (or any other component) to a PCB.

In addition to that, to able to encode a certain range of different currents, e.g. 100 mA . . . 2 A, a certain variety of resistors has to be on stock and chosen accordingly.

SUMMARY OF THE INVENTION

According to the invention, there is provided an electronic device, comprising:
a substrate;
a set of layers defining a device component having electrical characteristics;
a patterned area of the substrate, comprising a resistive track, wherein the resistance of the track encodes information concerning the electrical characteristics of the device component.

This device encodes relevant data concerning the electrical characteristics of the component onto the substrate. A track is used to encode this data, instead of additional active or passive components. In this way, the total thickness of the device does not need to be increased.

The resistive track can be provided at different stages in the production of the device. For example, it may provided as one of the last steps of the value chain. This gives the advantage that the same substrate design can be used for different products by just locally modifying them in one of the last steps. As substrates are currently typically patterned by photo lithography the process is not flexible and expensive masks are required for each product. Hence, being able to realize a number of products from the same substrate is advantageous compared to individual substrates for each product.

In one set of examples, the device comprises an LED device, the device component comprises the LED and the resistance of the track encodes information concerning the electrical LEO characteristics.

The track can be connected to a PCB (for example by electrically conductive glue, or using an anisotropic conductive film) so that the encoded information can be provided to the PCB without additional overall height of the system.

An LED driver can then interface with the PCB to obtain the LED device characteristics. The PCB thus functions as an interface between the resistive track and a driver. It may simply provide electrical connections, or it may include circuit components.

The PCB may already be a required part of the device design, for example a PCB may already present as part of an LED device design for improved current distribution on substrates with limited conductivity.

The resistive track can be formed from an already present substrate electrode (such as the LED anode layer), which comprises a certain film-resistivity which is typically one order of magnitude lower than highly conductive metal layers. This relatively low resistance then enables a resistance value to be used as an encoded measurable parameter.

The patterning process step to form the patterned area can integrated into different process steps already present in the LED fabrication, such as encapsulation removal by laser ablation, or photo-lithography used to pattern the electrode layers over the substrate. Patterning using laser ablation has the advantage that only software needs to be changed to realise different products.

The resistive track thus implements a tailor made resistance without adding process steps and additional parts. The encoding approach can be implemented with low cost, for example avoiding the need for optical read out of information or use of additional components.

The resistance can for example encode information concerning the desired driving voltage or a required dimming level. Additional information to these electrical parameters can be coded, such as the lighting area and parameters for the correct driver setting to individually drive red, green and blue (or other) units.

The patterned area of the substrate can be at a peripheral part of the substrate, so that the encoding does not affect the optical performance of the LED device.

The resistive track can be provided within a dedicated area with multiple non-aligned track sections within the area. This can a zig-zag track, a coiled track or a set of parallel track paths with U-bends, for example. By defining an area of an electrode layer as part of the LED substrate, patterning of this area into an equivalent wire of a defined length and cross section can be carried out in later process steps. For example, this process step can be a removal step for defining contact pads. Depending on the shape which is patterned different resistance values can be implemented, but using the same area of the substrate to define the wire shape.

The resistive track can for example comprise a rectangular region which has etched portions to define a serpentine track between end contacts.

The device can further comprise a PCB which connects to the patterned area of the substrate, the PCB having a pair of PCB contact pads for connection to ends of the resistive track. The PCB is then used as an interface to enable sensing of the resistance between the resistive track contacts. The PCB then implements the connection to as driver which can carry out the required testing.

The invention thus also provides an LED lighting apparatus comprising;

an LED device with attached PCB of the invention; and a driver comprising a connection part for interfacing with the PCB of the device, wherein the driver comprises:

testing circuitry for determining a resistance between the PCB contact pads.

The testing circuitry is thus part of the driver, so that the components which need to be carried by the PCB are kept to a minimum. The PCB acts as an interface between the driver and the substrate of the device. The PCB may carry no components at all and simply function as an interface.

Existing testing circuitry for determining the value, of a setting resistor can be used, so that existing driver architectures can be used.

The driver is adapted to drive the LED device in dependence on the information concerning the electrical characteristics of the LED device as determined by the testing circuitry.

The invention also provides a method of driving an electronic device which comprises a device component having electrical characteristics, the method comprising:

measuring a resistance of a resistive track on a substrate of the device, which resistance encodes information concerning the electrical characteristics of the device component; and driving the device using a driver which is controlled in dependence on the encoded information.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an electronic device in which an area of the device substrate is patterned to form a resistive track. The resistance information is provided to a driver, which can then derive information about the type of device being driven. The driver can thus be controlled accordingly. The track can encode electrical information such as driving voltage and/or current and dimming levels, but also other information such as size, shape, colour point, single or tuneable LED etc. A PCB can be used to interface between the device and a driver. The PCB may already be a required part oldie device design, for example a PCB may already be present as part of an LED device design fear improved current distribution on substrates with limited conductivity.

Figure 1:
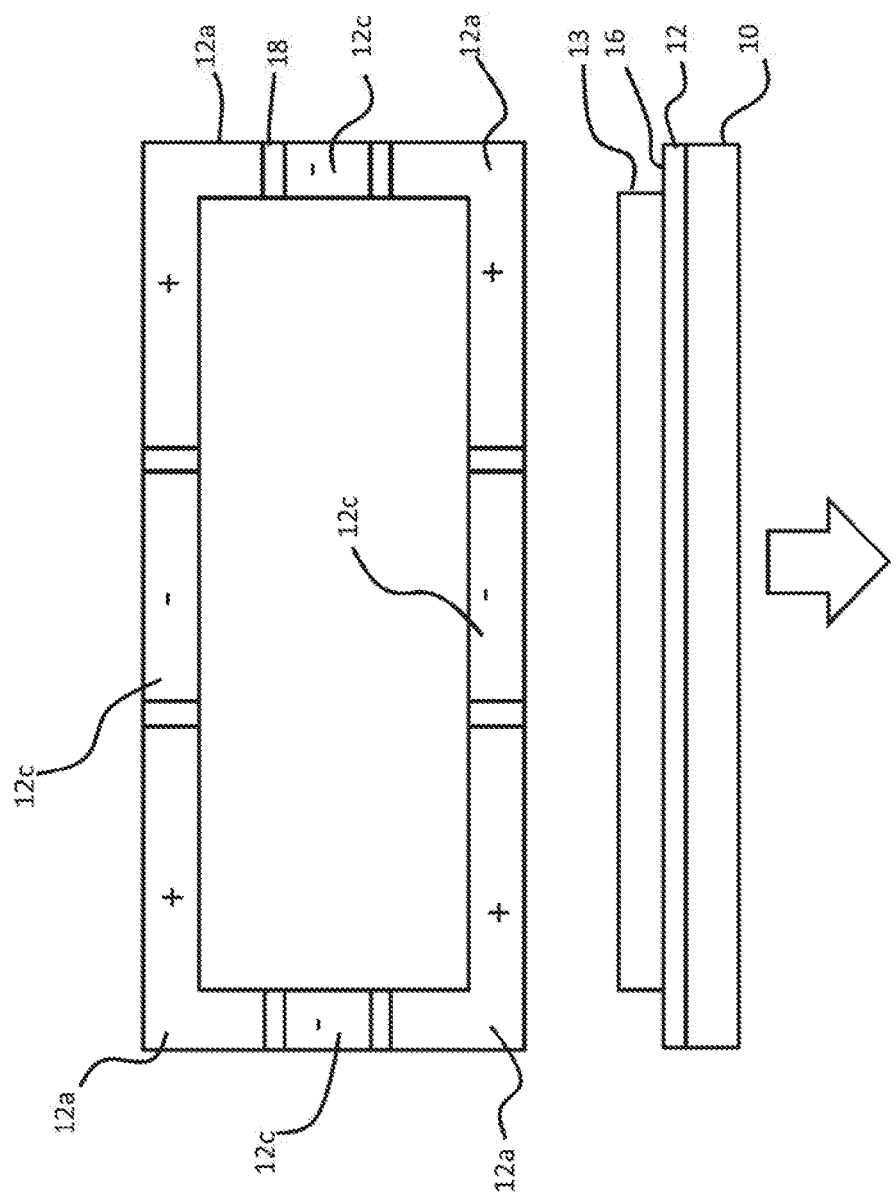
FIG. 1 shows an example of an OLED device.

FIG. 1 shows in simplified schematic form an example of OLED device to which the invention can be applied.

The OLED comprises a substrate 10 and a transparent conductive layer 12 over the substrate (transparent because this example is a bottom emitting structure). An encapsulated OLED structure is provided over the contact layer 12, represented by the layer 13. The OLED layers are much thinner than the substrate, so are not shown in FIG. 1. An outer ledge 16 of the contact layer 12 extends laterally beyond an outer edge of the encapsulated OLED structure.

The OLED structure has multiple anode and cathode contacts, and these connect to different contact regions of the contact layer 12 in the ledge area to form contact areas for the cathode and anode layers of the OLED structure. The plan view in FIG. 1 shows four cathode contact regions 12c, one at the centre of each edge of the OLED structure, and four anode contact regions 12a at the tour corners. Separation gaps 18 are provided between the contact regions.

FIG. 1 shows a bottom emitting OLED structure, with light emitted through the substrate. For this reason, the contact layer 12 is transparent, and can for example comprise ITO, ZnO:Al, or other transparent conductors, typically materials from the group of transparent conductive oxides (TCOs). New technologies such as carbon nanotubes or layer sequences can also used. The relatively high resistance of some transparent conductors, such as ITO, means that electrical connections with better conductivity are desired to distribute the current along the contact ledges to the anode contact regions and the cathode contact regions to reduce voltage drop and hence improve on homogeneity.

For this purpose, a PCB in a frame shape can be mounted over the contact ledge 16. The structure is shown in more detail in FIG. 2, with the PCB 20 mounted on the contact ledge 16.

Other approaches for forming contacts and to improve lateral current injection are available such as a bonded anisotropic conductive film ("ACF") or glued metal wires. These present a simpler and cheaper alternative to a PCB. In this case, a smaller PCB can provide the resistance measuring function of the invention (as described in more detail below) and does not need to provide interconnections between anode regions and between cathode regions. Thus, different technologies can used to provide electrical contacts to power the OLED and to the resistive track described below.

The structure of the OLEO device can conventional. A typical OLED according to the state of the art consists of active organic layers, a cathode, an anode, and a substrate. The active organic layers consist of a hole transport layer and a light emitting polymer for a polymer-based OLED (known as p-OLEDs). The small-molecule version of an OLED (known as sm-OLEDs) consists of some additional layers: hole injecting, emitting, hole blocking and electron transport layers. Furthermore functional layers like CGL (charge generation layers) can also included. The manufacture of the OLED can based on printed or evaporated OLEDs but also other/future techniques like liquid processing can be used.

The OLED active layers are deposited on a substrate which may coated with, for instance, indium tin oxide (ITO), thereby forming an ITO layer typically of about 150 nm to function as a hole-injecting electrode. The cathode applied on top of the organic layers which provides electron injection is of the order of 100 nm thick.

The OLED layer stack 11 (shown in FIG. 2) is provided between the contact layer 12 and an encapsulation 22 (these together are represented as the single layer 13 in FIG. 1). The contact layer 12 may function as the anode, and the layer stack comprises the organic layers and a top cathode metal. The substrate 10 is the substrate for the OLED stack. The substrate can be glass for rigid devices or it may be plastic (typically with a barrier layer) for example for flexible devices. Very thin glass substrates can also enable a degree of bending.

In the example shown, the encapsulation 22 overlaps the edge of the OLED layers 11 but terminates before the contact ledge 16, whereas the contact layer 12 extends filly to the outer edge so that the PCB 20 can connect to the contact regions. An alternative is to extend the encapsulation layers (in case of thin film encapsulation rather than glass encapsulation) to the edge of the device which is then locally removed in regions where contact with the underlying electrodes is desired.

The cathode layer can be sufficiently conductive to provide homogeneous devices of relevant dimensions. However, a metal foil 14 may also be provided over the top for heat distribution/dissipation and mechanical protection of the thin film encapsulation. An adhesive layer 15 bonds the metal foil (if present) to the encapsulation 22.

As one example only, the ledge width can be of the order of 3 mm, the overall device thickness can be approximately 1 mm to 3 mm based on a rigid glass substrate thickness typically in the range 0.7 to 2.0 mm. Thinner devices may be formed using bendable glass substrates or flexible plastics substrates. The overall panel size can have typical linear dimensions in the range 5 cm to 30 cm, although larger or smaller devices are possible.

The PCB 20 is glued to the OLED and hence is part of the module which is generally sold separately from the driver electronics. The PCB is not removable from the device substrate. The driver electronics is then wired to the PCB.

Figure 2:
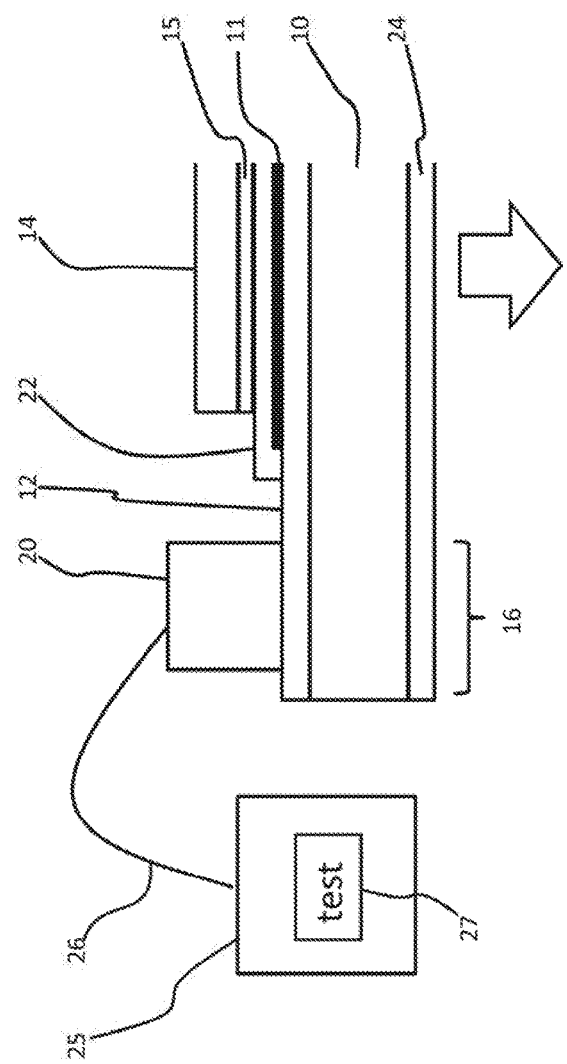
FIG. 2 shows how a PCB can be mounted on the OLED device ledge.

FIG. 2 shows schematically the driver 25 coupled to the PCB 20 by a flat cable 26, although a plug and socket can be used. This interconnection between the LED-PCB module and the driver can be located at a different place to the OLEO unit itself, for example set aside in a luminaire housing or in a piece of furniture.

The driver 25 includes testing circuitry 27, described further below. The combination of driver 25 and OLED module may change throughout the lifetime of an OLED, whereas the combination of an OLED and its associated PCB will not.

The printed circuit board 20 has a bottom metallisation layer which includes pads for connecting to the anode and cathode regions 12a, 12c. Conductive glue can used to bond these pads to the cathode and anode contact regions of the connection layer. The PCB has a second metallisation layer for providing interconnects between the anode regions and between the cathode regions. It might comprise even more layers in case more complex contacting structures are used, for example as may be required for colour-tuneable devices. Thus, the PCB comprises at least two conducting layers. Vias are used to connect between the layers at desired locations.

The second layer can be at the top or within the PCB structure.

In one embodiment, the PCB has a frame shape mounted over the outer ledge 16. In addition to interconnecting the cathode and anode regions, it provides the external contacts for electrical connection of the driver to the OLED as shown in FIG. 2. Other shapes of the PCB can used, or a number of smaller more local PCBs can be used to contact the cathode/anode layers if the device design allows for it.

FIG. 2 also shows a light diffusing foil 24 at the light output face of the OLED package. This may or may not be desired depending on the lighting application.

The invention makes use of the contact face between the PCB 20 and the contact layer 12 over the substrate 10 to provide encoding of the characteristics of the OLED.

In the preferred embodiment, a resistive track is formed from this contact layer. In this case, the design makes use of the limited conductivity of the thin-film electrode material; for ITO this is typically of the order of magnitude of 10Ω/sq depending on the film thickness. Typical values for the thickness are in the range of 90-160 nm.

By defining an area with two contact points and aligned to contact areas of a connected PCB, different resulting resistors can be created by patterning the area into a narrow path for the current. The result is equivalent to a wire with a certain resistance which can be calculated by:

$$R = \rho \frac{l}{A}$$

with ρ: specific intrinsic resistance, l: length of the wire and A: cross section of the wire.

The length and cross section can be influenced by patterning the electrode layer. For the cross section the height is defined by the thickness of the electrode layer, typically around 150 nm while width and length will be defined by locally removing material from the electrode. The specific intrinsic resistance depends on the material in use.

Typical materials for anode layers are from the group of electrically transparent and conductive oxides (TCO), and most prominent is indium tin oxide (ITO) as mentioned above.

Typical values of ρ for ITO deposited by heated sputtering from an indium tin target are in the range of ρ~120-160 μΩcm.

Figure 3:
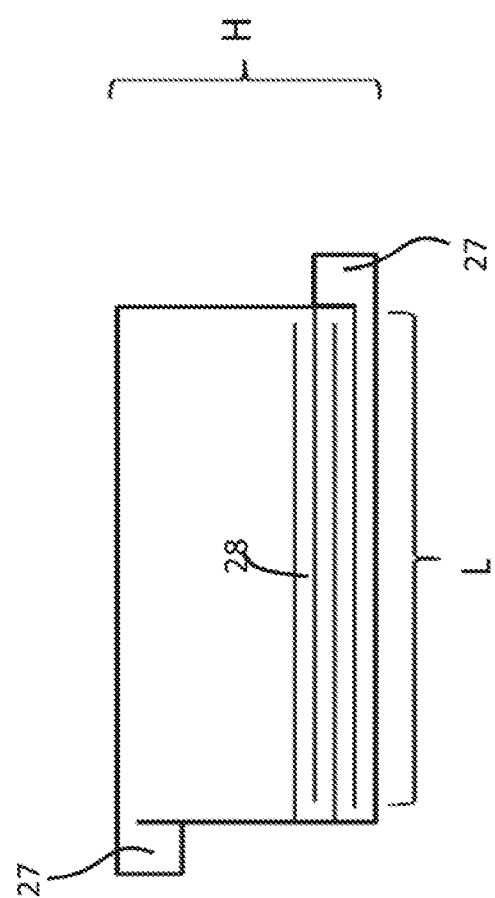
FIG. 3 shows an example of a resistive track used to encode electrical characteristic information about the OLED device.

FIG. 3 shows a rectangular area of length L and height H. There are two contact pads 27 at opposite sides (although they could be on the same side), and they are interconnected by a serpentine path of tracks 28. These tracks are defined by etched (ablated) lines. Thus, in FIG. 3, the lines represent removed, material and the solid white areas represent a sheet of conductive material such as ITO.

Ablating electrode material within the rectangular area now defines the resistance of the resulting wire by its pitch (the width of each individual track 28 and track spacing) and total length. In production, the type of pattern to be written into the same area can be quickly switched to reflect different products.

Figure 4:
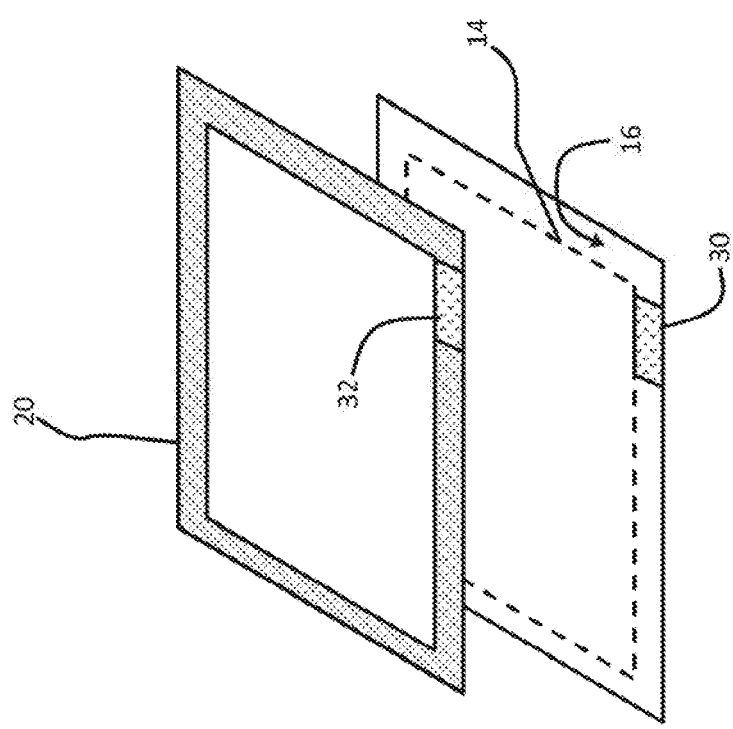
FIG. 4 shows a first example of a substrate and PCB of an LED arrangement in accordance with the invention, in schematic form.

The principle is illustrated and simplified in FIG. 4.

The ledge 16 of the OLED substrate is provided with the resistive track 30 which encodes information about the characteristics of the OLED.

The PCB 20 has a corresponding readout region 32 for interfacing with the pair of contact pads 27. Simple voltage driving and current measurement can used for determining the resistance, and this voltage driver and current measurement is preferably implemented in the driver so that the PCB functions purely as an interface between the resistor track and the driver. An alternative is to provide the measurement circuitry on the PCB itself.

Software can then be used to set the driver electronics to the appropriate mode. The driver electronics then has firmware or microprocessor controlled parameters, which are controlled in dependence on the encoded information.

The values for resistances can defined by choosing corresponding patterns that reflect other design rules for the OLED substrate design, in one embodiment they might he chosen as follows:

| Rset [Ω] | resulting driving current I [mA] |
|---|---|
| 0 | 100 |
| 820 | 392 |
| 3600 | 1085 |
| 27000 | 2000 |
| . . . | . . . |

Assuming a target resistance of 3600Ω, a value of ρ=155 μΩcm and an electrode film thickness of 155 nm, a patterned area of 100 mm² with an individual line pitch of 0.5 mm can be used. This can give up to 20 cm of equivalent wire length. These are pattern dimensions which can easily be achieved for example by laser ablation or photo lithographic patterning.

Typically, the required area can be in the range 50 to 200 mm² with a minimum track pitch in the range 0.3 to 0.6 mm.

The resistance may be implemented as a series of areas separated by cathode/anode contact areas and interconnected via the PCB to allow for a thin ledge while still achieving sufficient area to realize the required total resistance without creating large areas where no electrode contact can be formed between the device and the PCB.

The patterning process can either be included in the patterning process for the transparent electrode layer which is required anyway (for example for separation of cathode and anode regions) or it can be executed at one of the later steps in the processing, e.g. during removal of a thin film encapsulation. A typical process to remove the encapsulation can be laser ablation. Of course, additional process steps can be integrated to prepare the resistor track in case traditional encapsulation is used and no suitable laser process is at hand. Alternative patterning or material transformation processes can be used as well.

Alternatively, the resistive track patterning can be applied before applying a thin film encapsulation as the encapsulation can then be selectively removed above the contact pads 27 but can remain in place over the remainder of the area to protect the resistance pattern. If the contact layer area 30 will be exposed to ambient surroundings after the patterning step, e.g. due to the removal of a previously covering encapsulation, a suitable material may be applied to prevent material corrosion. Selection of such materials is standard to the experienced in the art.

FIG. 5 shows how the same area can used to define different resistances.

Figure 5A:
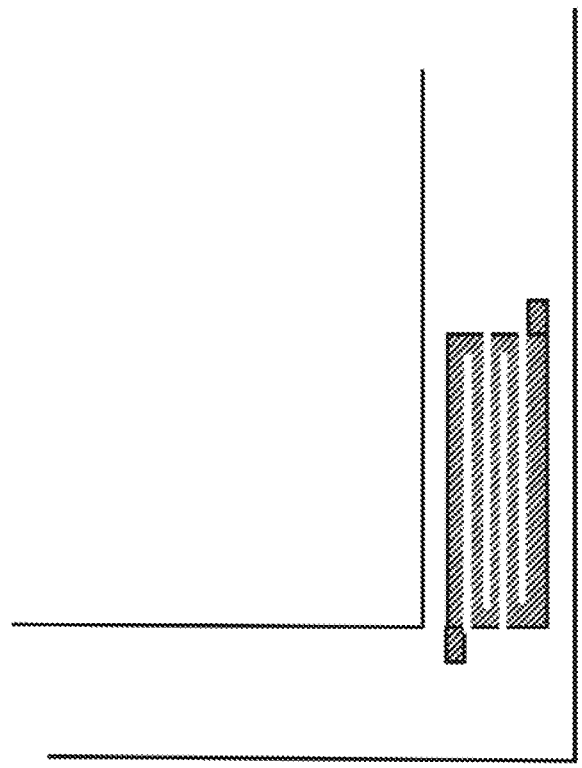
FIG. 5 shows how an area can be patterned to define a desired resistance value.

FIG. 5a shows a solid region 40 of conductive material, which gives rise to a minimum resistance for the given area. In case the minimum resistance cannot be achieved by full area coating of the contact layer, it can for example enabled by an additional coating of a thin metal layer which could for example be the same material as the cathode layer and could also be deposited within the same process step. In this case, making sure the encapsulation sufficiently protects the layers firming the resistance is desired.

In yet another embodiment, the area 30 may also be freed from conductive material and the track used to form the resistance may applied by a suitable process (e.g. coating, printing or the like). This may be required if the resistance and the boundary conditions for the product do not match so that the required resistances cannot be achieved using the existing layers.

Figure 5B:
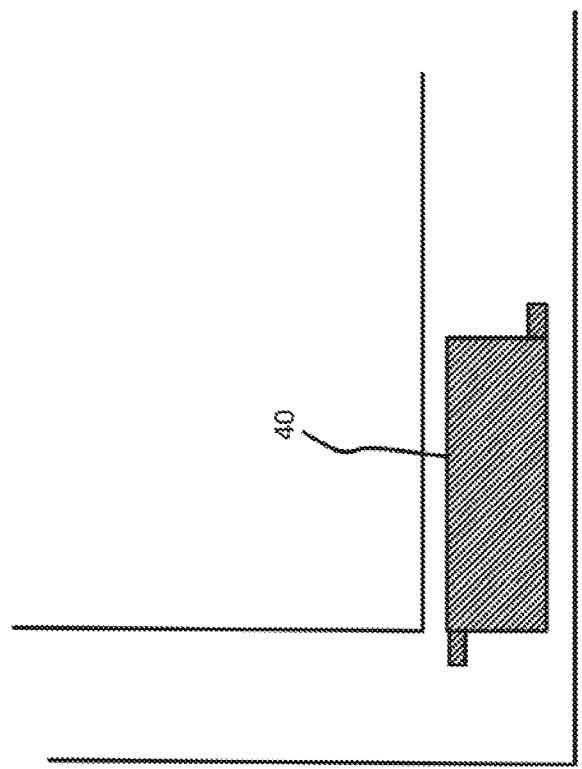

FIGS. 5b shows a pattern of serpentine tracks to give rise to a maximum resistance, when the tracks have the minimum pitch. By selecting intermediate pitch values, the resistance can freely selected.

The resistance can encode a set of values as in the table above. This enables a tolerance to factored into the design. For example, a measured resistance of 0 to 500Ω can be mapped to a 100 mA driving current. The number of different driving current values will depend on the accuracy with which the resistance can be defined and measured.

As an alternative, multiple resistive tracks can be used. Each resistive track encodes a value, and the values from the multiple tracks are then combined to derive the encoded information. The resistances of multiple tracks can be combined, so that the desired resistance is split between multiple tracks to enable them to smaller (as discussed above). An alternative is for a more complicated encoding scheme. For example, one resistive track can encode a set of least significant bit (LSB) values and another resistive track can encode a set of most significant bit (MSB) values, and they together form a larger number of possible encoded values.

The number of different encoding levels per resistive track make up for a total number of possible combinations. The nature of the product family and the requirements regarding the amount of data to be encoded determine the number of tracks required and the number of possible variations of lengths of the individual tracks.

In principle any number of different Rset values can realized from a region assuming the initial dimensions of the patterned area (before patterning) have been chosen correctly. The aspect ratio of the patterned area, the dimensions and the number of patterned areas will be selected by a product designer, depending on the requirements (such as the dimensions of the ledge, the overall product, and the number of different products from one substrate which dictates the required amount of data to be encoded).

For LED devices, there is a desire to reduce the width of the non-light-emitting frame as much as possible. The width of a PCB strip is currently typically of the order of magnitude of a few mm, for example 2 to 4 mm, it may be desired to make the patterned area with a width of less than 2 mm. The lateral dimensions of OLEDs are increasing, hence the length that can be used to encode data is increasing as well.

From the manufacturing perspective, to facilitate alignment and gluing, it may be desired to maintain a larger contact pad size than the line pitch, for example 2 mm×2 mm contact pads at the end of the resistive track.

The patterning approach shown in FIG. 5 can start from as generic substrate design as in FIG. 5a. The substrate electrode material can then be ablated by a flexible scanning laser patterning process or the like after the OLED has been prepared, and just prior to attaching the PCB. The relevant ablation data can be generated from the current job data of the manufacturing line, so that the current OLED characteristics are known.

The processing of the electrode material layer can also be combined with existing steps of the process, for example combined with the process used to pattern the thin film encapsulation.

The PCB has a corresponding pair of read-out pads at the relevant positions to interconnect with the terminals. In this way, a single PCB design and a single substrate design can be used to fabricate different devices with varying architectures while giving the possibility for the driver to detect the characteristics of the individual OLED stack.

As explained above, the main purpose is to provide electrical driving data for the OLED to the driver. However, the coding can also be used to code other data, such as production data, type names, job names, etc.

The electrical driving parameters can be used for example to deliberately set a certain new device to a luminance level comparable to devices of the same type but already being used for a while or of different/older architecture. This means that a new OLED can be driven in a way which simulates ageing in order to match other OLEDs of the overall luminaire. This enables the integration of new devices into an existing installation/luminaire comprising older devices as well without appearing visually different.

The amount of data to be encoded depends on the range of functionality of the device that is to be controlled. At present, for OLED devices, this control is generally limited to brightness control, and there is a small range of different shapes and dimensions.

The example above makes use of a PCB frame. However, mechanical support can be realized (at least partially) by an additional metal frame. Typically there is either only as frame of metal around the device or else a metal frame can have an additional mesh or grid extending inside the emitting area. The PCB can then be provided as a smaller unit or a set of smaller units.

The invention can also be applied to a backside-contacted OLED. The most promising feature of backside-contacted OLEDs is that the non-illuminating area surrounding frame can omitted, so that light sources can be placed adjacent each other to form a continuous lighting area.

Figure 6:
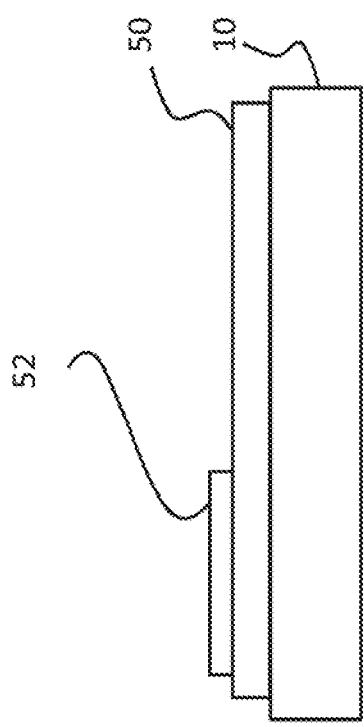
FIG. 6 shows a second example of a substrate and PCB of an LED arrangement in accordance with the invention, in schematic form.

FIG. 6 shows an OLED structure 50 over a substrate 10, with the PCB 52 with read out pads over the back of the OLED structure. There is a localized area on the back of the OLED which comprises a pattern structure to interface with the PCB.

When contacting to the back side, the main difference is the material on the surface. For example, either MAM (Molybdenum-Aluminum-Molybdenum) or a transparent conductive oxide is used for the back side contact The PCB 52 of FIG. 6 has the same contact pad arrangement as described above but there is no current distribution function. The PCB provides contacts to power the OLED and it has the patterned read-out area. A specially prepared area of the back side is used to form the resistive tracks that are connected to the PCB contact pads. The PCB does not have to cover the whole area of the lighting unit as shown in FIG. 5.

The device description encoded in the resistive track can be placed very late in the production process and in a flexible manner, related to the manufacturing job.

The examples above make use of the PCB for readout of data as well as for providing power supply to the OLED and/or for improving contact conductivity. However, a different technology can be used to provide electrical contacts to power the OLED, with a separate local PCB applied to provide the read out function. The invention can even be realized without the use of a PCB at all in case the contact pads 27 can be used to directly solder wires to them to make contact towards the driver.

The examples above relate to LED lighting systems. However the invention can be applied to any device in which a driver and a device are manufactured separately, so that the device and driver may evolve at different rates, thereby requiring compatibility between different drivers and devices. An example is solar panels, where the driver processes the generated electrical energy, but may need to know the characteristics of the connected solar panel.

Thus, the invention can be applied to all types of LED devices, in particular OLED devices. It is of particular interest for general lighting applications and OLED based luminaires. For example the encoded information can relate to a light output panel with a single output area which has controllable brightness and/or colour.

Other variations to the disclosed embodiments can understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot used to advantage. Any reference signs in the claims should not construed as limiting the scope.

The invention claimed is:

1. A LED device, comprising:
    a substrate;
    a set of layers defining a LED component having electrical characteristics;
    a patterned area of the substrate, comprising a resistive track, wherein the resistance of the track encodes information concerning the electrical characteristics of the LED component, and wherein the resistive track is formed from a conductive layer which. defines the anode or cathode of the LED.

2. The LED device of claim 1 where the LED device is an OLED device.

3. The LED device of claim 1 where there are multiple resistive tracks, each resistive track encodes a value and the values from the multiple tracks are combined to derive the encoded information.

4. The LED device as claimed in claim 1, wherein the conductive layer defines the LED anode.

5. The LED device as claimed in claim 1, wherein the information concerning the electrical characteristics of the LED component is a desired driving current and/or voltage and/or a required dimming level.

6. The LED device as claimed in claim 1, wherein the patterned area of the substrate comprising the resistive track is at a peripheral part of the substrate.

7. The LED device as claimed in claim 1, wherein the resistive track is provided within a dedicated area with multiple non-aligned track sections within the area.

8. The LED device as claimed in claim 7, wherein the resistive track comprises a rectangular region which has etched portions to define a serpentine track between end contacts.

9. The LED as claimed in claim 1, further comprising a PCB which connects to the patterned area of the substrate, the PCB having a pair of PCB contact pads for connection to ends of the resistive track.

10. A LED lighting apparatus comprising:
    the LED device as claimed in claim 9, wherein the device component comprises the LED and the resistance of the track encodes information concerning the electrical LED characteristics; and
    a driver comprising a connection part for interfacing with the PCB of the device, wherein the driver comprises testing circuitry for determining a resistance between the PCB contact pads.

11. A LED lighting apparatus as claimed in claim 10, wherein the driver is adapted to drive the LED device in dependence on the information concerning the characteristics of the LED device as determined by the testing circuitry.

12. The LED device of claim 4 wherein the conductive anode extends laterally beyond an outer edge of the encapsulated LED device to provide a contact layer on the substrate that comprises the patterned resistive track.

13. The LED device of claim 8 wherein the serpentine track is in the form of a zig-zag track, a coiled track or a set of parallel track paths with U-bends.

14. A method of driving a LED device which comprises a LED component having electrical characteristics, the method comprising:
    providing a patterned area of the substrate, comprising a resistive track formed from a conductive layer which defines the anode or cathode of the LED, wherein the resistance of the track encodes information concerning the electrical characteristics of the LED component;
    measuring a resistance of the resistive track; and
    driving the device using a driver which is controlled in dependence on the encoded information.

15. The method as claimed in claim 14, wherein the resistance encodes information concerning a desired driving current and/or voltage and/or a required dimming level.

16. The method as claimed in claim 14, wherein the measuring comprises connecting ends of the resistive track to contact pads of a PCB, and coupling the PCB to an LED driver.

* * * * *